(12) United States Patent
Suwa et al.

(10) Patent No.: US 8,098,118 B2
(45) Date of Patent: Jan. 17, 2012

(54) BANDPASS FILTER AND PROCESS OF FABRICATING THE SAME

(75) Inventors: Atsushi Suwa, Osaka (JP); Koji Sasabe, Hirakata (JP); Futoshi Nishimura, Yawata (JP); Yoshiki Hayasaki, Osaka (JP); Tomoaki Matsushima, Kizugawa (JP); Sibei Xiong, Tsukuba (JP); Takaaki Yoshihara, Osaka (JP); Norihiro Yamauchi, Shijounawate (JP); Takeo Shirai, Osaka (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 331 days.

(21) Appl. No.: 12/528,070

(22) PCT Filed: Feb. 19, 2008

(86) PCT No.: PCT/JP2008/053128
§ 371 (c)(1),
(2), (4) Date: Aug. 20, 2009

(87) PCT Pub. No.: WO2008/108193
PCT Pub. Date: Sep. 12, 2008

(65) Prior Publication Data
US 2010/0117763 A1 May 13, 2010

(30) Foreign Application Priority Data
Feb. 23, 2007 (JP) ................... 2007-044560

(51) Int. Cl.
H03H 9/46 (2006.01)
H01P 3/08 (2006.01)

(52) U.S. Cl. .......... 333/191; 333/189; 333/246

(58) Field of Classification Search .......... 333/187, 333/188, 189, 191, 192, 246
See application file for complete search history.

(56) References Cited

U.S. PATENT DOCUMENTS
6,982,612 B2 * 1/2006 Sakano .......... 333/133
(Continued)

FOREIGN PATENT DOCUMENTS
EP 0 083 132 A2 7/1983
(Continued)

OTHER PUBLICATIONS
International Search Report for the Application No. PCT/JP2008/053128 mailed Jul. 8, 2008.
(Continued)

Primary Examiner — Dean O Takaoka
(74) Attorney, Agent, or Firm — Cheng Law Group, PLLC

(57) ABSTRACT

A bandpass filter includes a combination of a BAW filter and a patterned planar filter with stubs. The BAW filter is composed of a plurality of piezoelectric resonators to give a specific frequency bandpass, while the planer filter is configured to attenuate frequencies near and outside the bandpass. The resonators are connected in a ladder configuration between a first signal transmission path and a ground. The planar filter includes a strip line formed on a dielectric layer to define a second signal transmission path. The BAW filter and the planar filter are formed on a common substrate with the first and second transmission paths connected to each other. The BAW filter, in combination with the patterned planar filter added with the stub, can improve a deep near-band rejection inherent to the BAW filter, exhibiting an excellent out-of-band rejection over certain adjacent frequency ranges outside of the bandpass, and therefore give a sharp and wide bandpass.

9 Claims, 9 Drawing Sheets

U.S. PATENT DOCUMENTS

| | | |
|---|---|---|
| 2002/0180382 A1 | 12/2002 | Chatenet |
| 2006/0028298 A1 | 2/2006 | Nakamura et al. |

FOREIGN PATENT DOCUMENTS

| | | |
|---|---|---|
| EP | 0 083 132 A3 | 7/1983 |
| JP | 2005-295316 A | 10/2005 |
| WO | WO-2007/018436 A2 | 2/2007 |
| WO | WO-2007/018436 A3 | 2/2007 |

OTHER PUBLICATIONS

"Microwave Filters, Impedance-Matching Networks and Coupling Structures Passage", Artech House Books, Jan. 1980, XP002408547, pp. 11, 360-363, 374, 375.

* cited by examiner

BANDPASS FILTER AND PROCESS OF FABRICATING THE SAME

TECHNICAL FIELD

The present invention is directed to a bandpass filter, particularly for use in an ultra-wide band (UWB) application with an excellent out-of-band rejection, and a process of fabricating the bandpass filter.

BACKGROUND ART

Recently, there has been an increased demand of developing the UWB technique to realize a high speed data transmission at several hundreds of mega bits per second within a permitted frequency range of 3.1 GHz to 10.6 GHz. In order to comply with regulations with regard to the UWB communication, a bandpass range is restricted to be 500 MHz or 25% of a central frequency, and is different from a specific bandpass around 1.6 GHz given to the GPS (global positioning system). Therefore, the UWB application necessitates a bandpass filter with good near-band rejection.

Japanese Patent Publication (JP 2005-295316 A) proposes a bandpass filter available for the UWB application. The proposed bandpass filter includes a multiplicity of ring resonator. The ring resonators are set to have different attenuation frequency ranges, and are coupled to obtain a desired wide bandpass. However, since each ring resonator is inherently given a relatively narrow rejection band, the combination of the ring resonators is likely to pass undesired frequency or fail to attenuate the undesired frequency to a practically admissible level. Further, since each of the ring resonators is required to have a diameter of up to 1 cm for use in the UWB application, the combination of the ring resonator occupies a relatively large space and is therefore not suitable for incorporation into a miniaturized device.

DISCLOSURE OF THE INVENTION

In view of the above problem, the present invention has been achieved to provide a bandpass filter which is compact and efficient for rejecting out-of-band frequencies. The bandpass filter in accordance with the present invention include a bulk acoustic wave (BAW) filter composed of a plurality of piezoelectric resonators to give a specific frequency bandpass, and a patterned planer filter configured to attenuate frequencies near and outside the bandpass. The resonators, each including includes a piezoelectric element disposed between a lower electrode and an upper electrode, are connected in a ladder configuration between a first signal transmission path and a ground to provide the bandpass. The planar filter includes a strip line structure composed of a ground conductor, a dielectric layer on the ground conductor, and a strip line formed on the dielectric layer to define a second signal transmission path. The strip line is added with at least one stub composed of a loading segment extending in a spaced relation from the strip line and a tap segment extending from said strip line and merging at an intermediate portion of the loading segment between the opposite lengthwise ends thereof. The BAW filter and the planar filter are formed on a common substrate with the first and second transmission paths connected to each other. The BAW filter thus combined with the patterned planar filter added with the stub can improve a deep near-band rejection inherent to the BAW filter, exhibiting an excellent out-of-band rejection over certain adjacent frequency ranges outside of the bandpass, and therefore give a sharp and wide bandpass. Further, the planar filter is realized by making the use of the substrate common to the BAW filter, and is adds only a small space requirement to a compact structure inherent to the BAW filter, thereby maintaining the combination bandpass filter sufficiently compact. Especially, the addition of the stub to the strip line can shorten the length of the planar filter as well as improve an effect of attenuating the out-of-band frequencies.

Preferably, the dielectric layer of the strip line structure is made of a dielectric material having a relative dielectric constant of 8 or more.

For instance, the dielectric layer is made of the same material of the piezoelectric element of the piezoelectric resonator for the purpose of reducing the number of materials constituting the combination bandpass filter for easy fabrication thereof.

In addition, the dielectric layer is preferred to have the same thickness as the piezoelectric element of each resonator for easy fabrication of the combination bandpass filter.

Most preferably, the dielectric material forming the piezoelectric segment and the dielectric layer is lead zirconate titanate (PZT) which has a remarkably high relative dielectric constant of as much as 100 to 3000.

The BAW filter may have a plurality of the piezoelectric resonators which are disposed in a two-dimensional arrangement on the substrate while sharing a single piezoelectric element. For this purpose, the BAW filter includes a plurality of upper electrodes each being laid over the piezoelectric element, and a plurality of lower electrodes each disposed under the piezoelectric element in contact therewith. At least one of the upper electrodes is designed to have portions respectively overlapping with two or more different ones of the lower electrodes with corresponding portions of the piezoelectric element interposed therebetween, and at least one of the lower electrodes is designed to have portions respectively overlapping with two or more different ones of the upper electrodes with corresponding portions of the piezoelectric element interposed therebetween to define a plurality of the piezoelectric elements which are electrically connected with each other in a ladder configuration. Thus, a plurality of the piezoelectric resonators can be closely packed within a limited space to make the BAW filter and the resulting bandpass filter compact.

The present invention also proposes a process of fabricating the above bandpass filter. In the process, the common substrate is formed thereon with a first layer of electrically conductive material which is later etched out to leave the lower electrode for each piezoelectric resonator and the ground conductor. Then, a seed layer of a specific crystalline orientation is deposited on one part of the first layer, corresponding to the BAW filter. Subsequently, a piezoelectric layer is deposited on the seed layer and also on the other part of the first layer corresponding to the patterned planar filter. The piezoelectric layer is later etched out to leave the piezoelectric element of each resonator of the BAW filter and the dielectric layer of the patterned planar filter. Thereafter, a second layer of electrically conductive material, which is later etched out to leave the upper electrode of each resonator and the strip line, is formed on the piezoelectric layer to give a laminate. Finally, the resulting laminate is etched out together with the first and second layers to develop the piezoelectric resonators and the strip line structure on the common substrate. Thus, the BAW filter and the patterned planar filter are realized on the common substrate while sharing the piezoelectric layer to form the piezoelectric elements of the BAW filter and the dielectric layer of the patterned planar filter. Further, this process makes it easy to have the top surface of the BAW filter, i.e., the upper electrodes in flush with the strip line of the patterned planar filter, thereby realizing a smooth flat structure.

The seed layer is preferred to be selected from a material which is different from that of the piezoelectric layer and controls epitaxial growth of the piezoelectric layer in order to give a desired attenuation effect to the BAW filter by restraining lateral oscillations.

In an alternative process, the ground conductor is formed over one part of the substrate and the dielectric layer is formed on the ground conductor and over the other part of the substrate. Then, a first layer of electrically conductive material is deposited on the dielectric layer followed by a step of etching the first layer to leave the strip line and the lower electrode of each of the piezoelectric resonators. Subsequently, a seed layer of a specific crystalline orientation is deposited on the lower electrode, and a piezoelectric material is deposited on the seed layer and is caused to develop into the piezoelectric element having the same crystalline orientation as the seed layer. Thereafter, the upper electrode is formed on each piezoelectric element. With this process, the first layer is commonly utilized to form the lower electrodes of the BAW filter and the strip line structure of the patterned planar filter.

These and still other advantageous features of the present invention will become more apparent from the following detailed explanation of the preferred embodiments when taken in conjunction with the attached drawings.

BEST MODE FOR CARRYING OUT THE INVENTION

Figure 1:
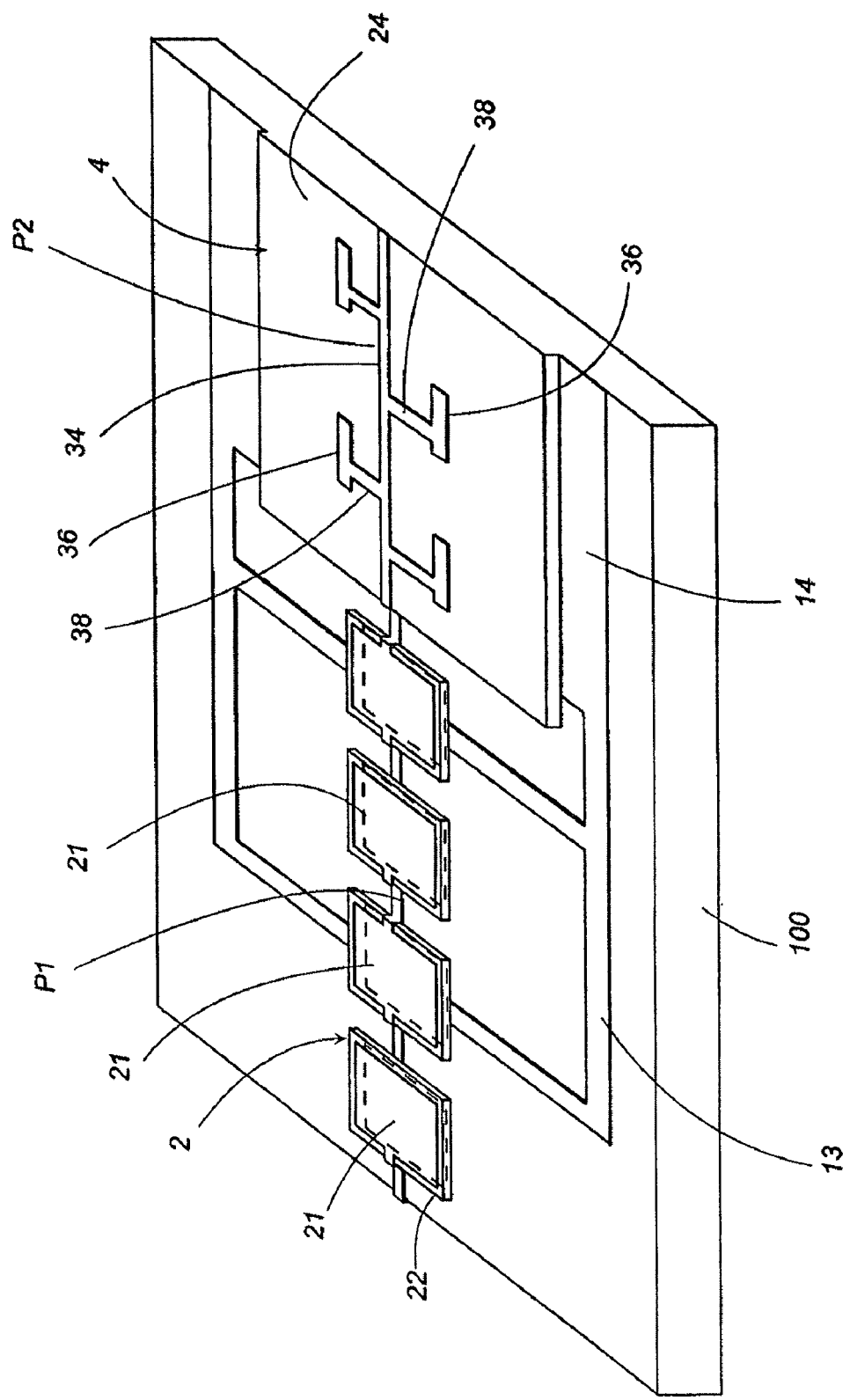
FIG. 1 is a perspective view of a bandpass filter in accordance with a first embodiment of the present invention.
Figure 2:
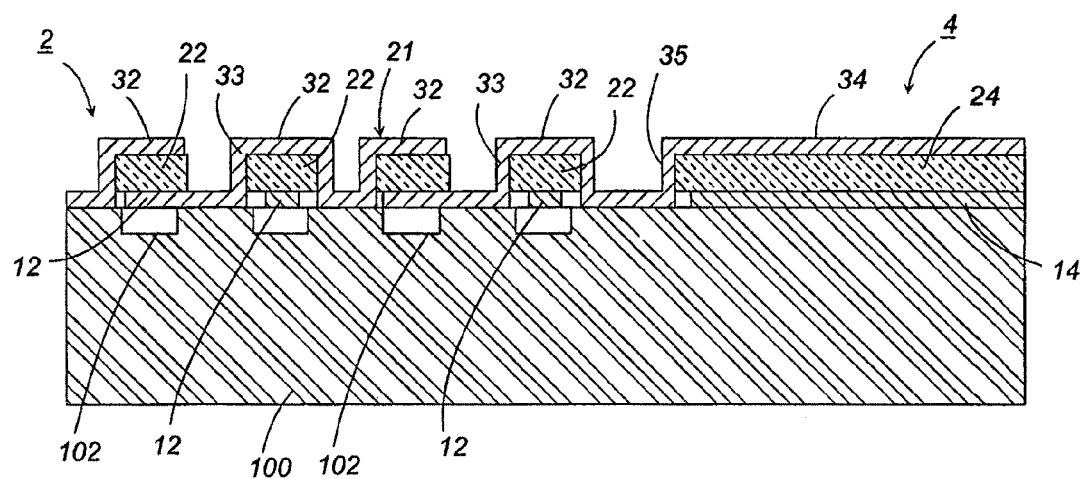
FIG. 2 is a sectional view of the above bandpass filter

Referring now to FIGS. 1 and 2, there is shown a bandpass filter in accordance with a first embodiment of the present invention. The bandpass filter is designed for use in the ultra-wide band (UWB) application to have a bandpass in a frequency range of 3.5 GHz to 3.9 GHz, for example. The bandpass filter is a combination of a bulk acoustic wave (BAW) filter 2 and a planar patterned filter 4 which are formed on a common substrate 100 which is made of a semiconductor material of silicon, for example.

Figure 3:
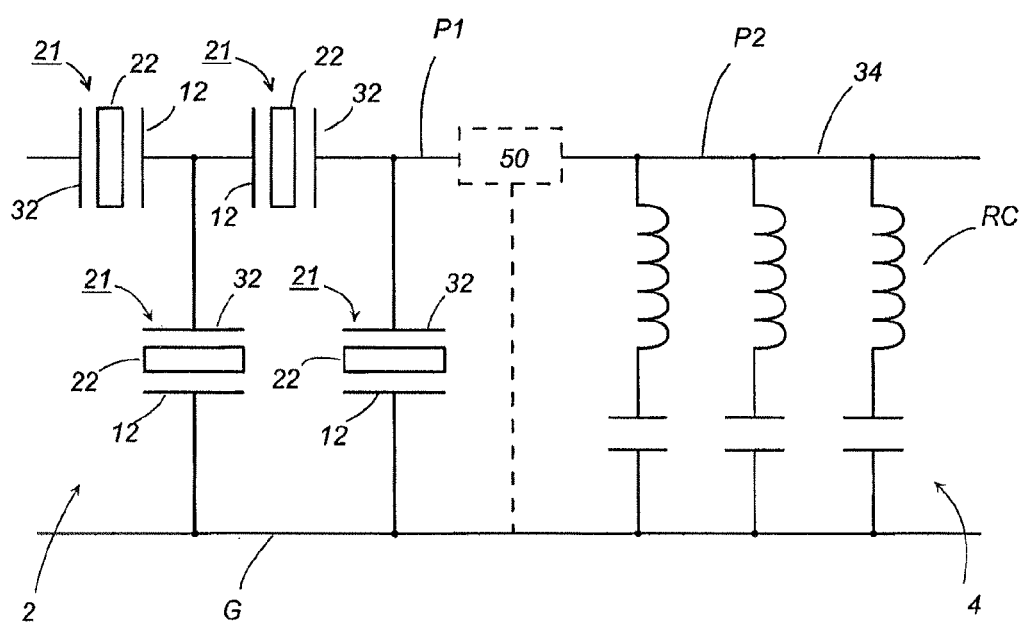
FIG. 3 is a circuit diagram of the above bandpass filter.
Figure 4A:
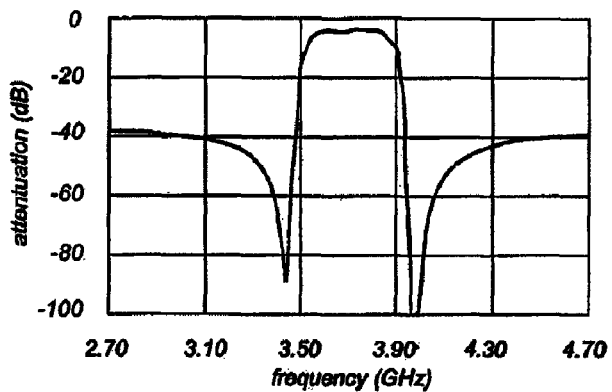
FIGS. 4A to 4D are graphs illustrating attenuation effects outside of the bandpass of the present invention in relation to a single BAW filter and a single patterned filter.

The BAW filter 2 includes a plurality of film bulk acoustic piezoelectric resonators 21 each composed of a piezoelectric element 22 disposed between a lower electrode 12 and an upper electrode 32. The resonators 21 are connected in a ladder configuration, as shown in FIG. 3, between a first signal transmission path P1 and a ground to provide the bandpass of the frequency. The substrate 100 is formed in its top surface with a plurality of cavities 102 disposed in closely adjacent relation to the piezoelectric element 22 so as to allow each element to oscillate in its thickness direction for the purpose of passing the bandpass frequencies. The cavities 102 are formed by a deep etching technique such as, anisotropic etching or deep-reactive anisotropic etching. The piezoelectric element 22 is made of lead zirconate titanate (PZT) having a relative dielectric constant of 100 to 3000. PZT is selected to have a tetragonal structure of which crystalline orientation of [001] is aligned in the thickness of the element 22 in order to reduce 90° domain and therefore restrain a lateral oscillation mode, for improve a cut-off characteristic outside of the bandpass, i.e., giving a deep near-band rejection, as shown FIG. 4A. In the figure, a deep attenuation is seen at frequencies immediately outside of the bandpass. As will be discussed later, the PZT having the above specific crystalline orientation is formed by use of a seed layer on which the piezoelectric element develops. In the ladder coupling of the resonators 21, the each of the resonators 21 have its upper electrode 32 connected with the upper electrode or the lower electrode of the adjacent resonator by means of a bridge 33, while the lower electrodes 12 of the two resonators are connected to a ground line 13. Although the PZT having the above specific crystalline structure is preferred, the piezoelectric material may be AlN, ZnO, or like material having the relative dielectric constant of 8 or more.

As shown in FIGS. 1 and 2, the planar patterned filter 4 has a strip line structure composed of a strip line 34, a ground conductor 14, and dielectric layer 24 interposed therebetween. The ground conductor 14 is connected to the lower electrodes 12 of the two resonators through the ground line 13. The dielectric layer 24 is made of the same material forming the piezoelectric elements 22 to have the same thickness as the piezoelectric elements. The strip line 34 is formed on the dielectric layer 24 to define a second signal transmission path P2 which is connected to the upper electrode 32 of the first signal transmission path P1 of the BAW filter 2, i.e., connected through a bridge 35 to the upper electrode 32 of the adjacent resonator 21. The strip line 34 defines an output end at its one end opposite to the BAW filter 2, while the upper electrode 32 of the resonator remote from the strip line 34 defines an input end for receiving the signal. The strip line 34 formed on the dielectric layer 24 has impedance $Z_0$ as determined by the following equation.

$$Z_0 = \frac{60}{\sqrt{\varepsilon_0}} \times \ln\left(\frac{8}{W/d} + \frac{(W/d)}{4}\right)$$

in which $\varepsilon_0$ is an effective relative dielectric constant of the dielectric layer, W is a length of the strip line, and d is a thickness of the dielectric layer.

Figure 4B:
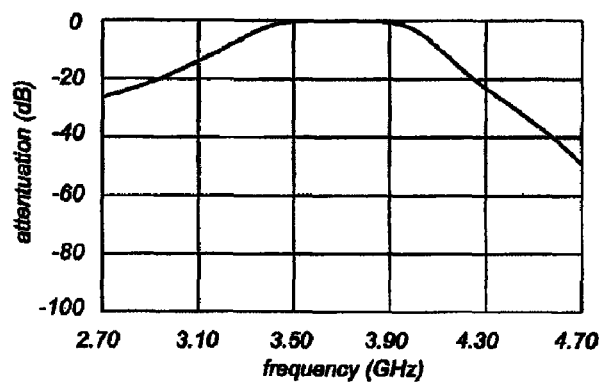

The strip line 34 is added with a plurality of generally T-shaped stubs each composed of a loading segment 36 extending in parallel with the strip line 34, and a tap segment 38 extending from the strip line and merging at an intermediate portion of the loading segment 36. The tap segment 38 may be configured to merge at the center of the loading segment 36 at a point offset from its center, or even at one lengthwise end of the loading segment. The loading segment 36 is spaced away from the ground conductor 14 to add an open-stub circuit to the strip line. Each of thus formed stub circuits functions as a reactance circuit RC, as shown in FIG. 3, which forms a resonant circuit of attenuating the frequencies around the resonant frequency. As the dielectric constant of the dielectric layer 24 increases, the effect of attenuating the frequencies around the resonant frequency is obtained at a reduced length of the tap segment 38. With this result, the use of the dielectric layer 24 having a high relative dielectric constant as much as 8 or more enables to make the planar patterned filter compact, and therefore the whole bandpass filter. Particularly, the dielectric layer made of PZT having the relative dielectric constant of 100 to 3000 is responsible for minimizing the patterned filter. The stub circuits are designed to give corresponding resonant circuits having different resonant frequencies from each other to attenuate the frequencies over a wide range, so that the patterned filter 40 alone exhibits a broad cut-off characteristic, as shown in FIG. 4B, of attenuating the frequencies over a relatively wide range but to a less extent in comparison with that obtained by the BAW filter 2.

Figure 4C:
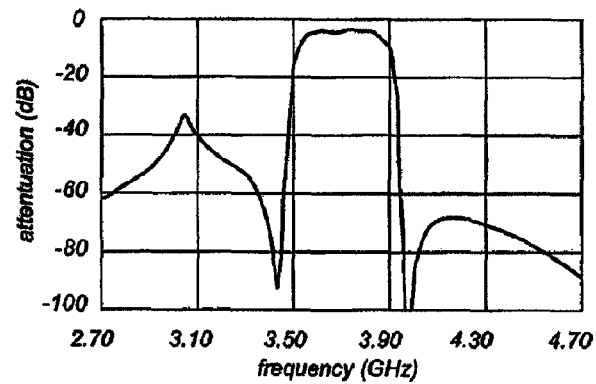

However, as shown in FIG. 4C, when thus formed planar patterned filter 4 is added to the BAW filter 2, the frequencies outside the near-band frequencies can be attenuated to a deeper extent than expected alone by the BAW filter.
With this result, the combination of the above BAW filter 2 and the planar patterned filter 4 can attenuate the frequencies outside of the bandpass to a deep extent, thereby realizing superior out-of-band rejection over a wide range sufficient for use in the UWB communication.

Figure 4D:
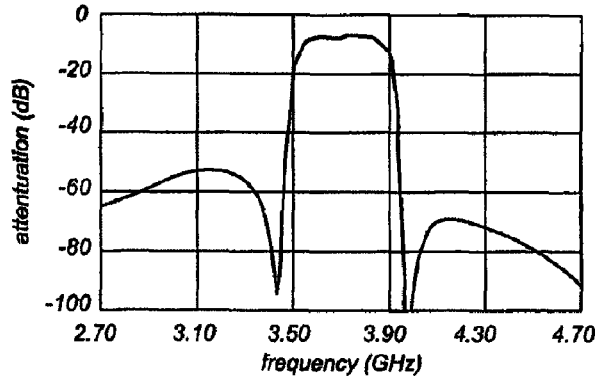

When an attenuator 50 is interposed between the BAW filter 2 and the patterned filter 4, the above out-of-band rejection is further improved, as shown in FIG. 4D, to flatten the curve at a specific frequency of 3 GHz. The attenuator may be configured as a π-type attenuator of giving −3 dB attenuation, for example, and be realized by a resistor incorporated in a coupling line between the strip line 34 and the upper electrode of the adjacent piezoelectric element 21.

Figure 5A:
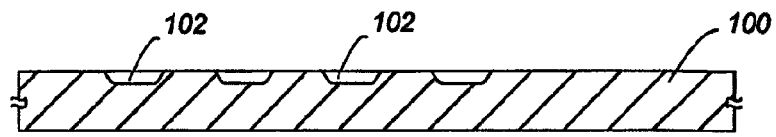
FIGS. 5A to 5G are sectional views illustrating steps of fabricating the above bandpass filter.
Figure 5B:
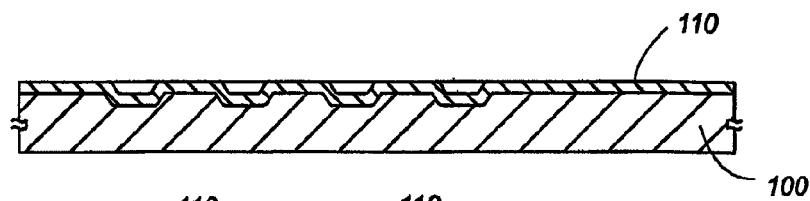
Figure 5C:
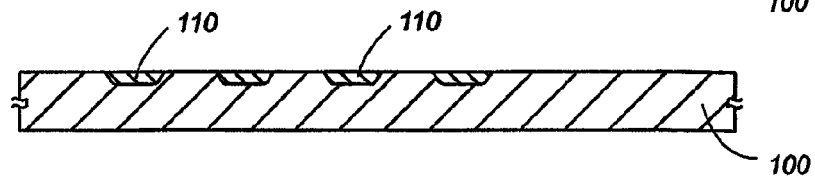
Figure 5D:
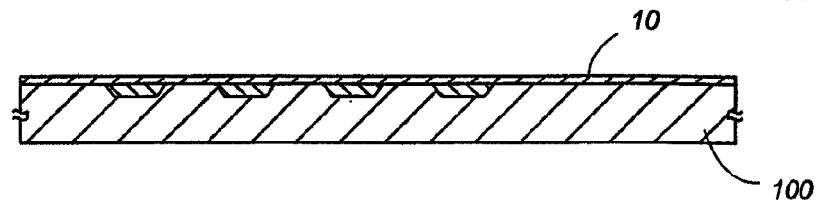
Figure 5E:
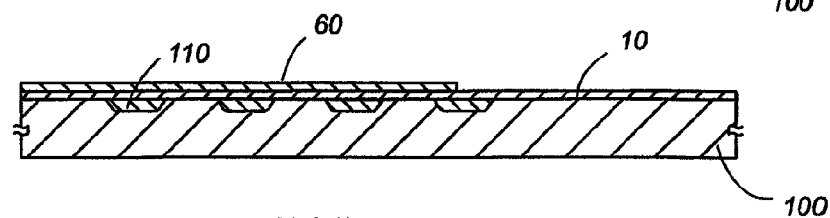
Figure 5F:
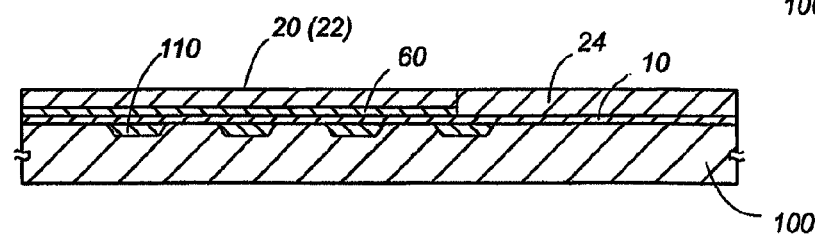
Figure 5G:
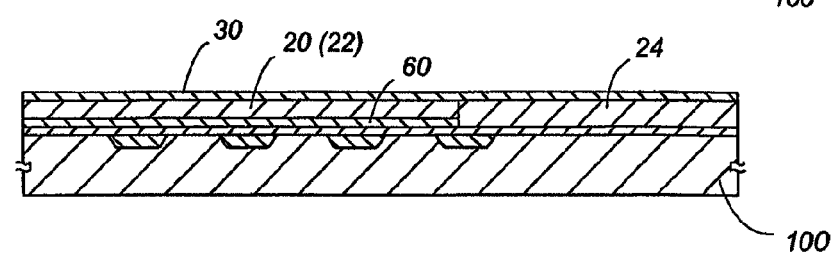

A process of fabricating the bandpass filter is now explained with reference to FIGS. 5A to 5B. The substrate 100 is made of a single-crystal silicone of which top surface is defined by [100] face of the crystalline structure. Firstly, the substrate 100 is thermally oxidized to form a silicon oxide (SiO2) layer in its top surface, which is masked by a suitable film and is etched to form the cavities 102 in top of the substrate 100 followed by the silicon oxide layer being removed together with the mask, as shown in FIG. 5A. Then, a sacrifice layer 110 is deposited by a CVD (chemical vapor deposition) method over the entire top surface of the substrate 100 including the cavities 102, as shown in FIG. 5B, and the sacrifice layer 110 is polished out by a CMP (chemical mechanical polish) from the top surface of the substrate to remain only in the cavities 102, as shown in FIG. 5C. Subsequently, a first layer 10 of electrically conductive metal material such as Pt or Ir is deposited on the top surface of the substrate 100, as shown in FIG. 5D. The first layer 10 is then etched out to form the ground conductor 14 of the patterned filter 4, the lower electrodes 12 of the BAW filter 2, and the ground line 13, as mentioned in the above. The first layer may be a combination of two or more metal coatings. Next, a seed layer 60 of a piezoelectric material is deposited partly on one part of the first layer 10 subsequently formed into the BAW filter 2, as shown in FIG. 5E. The seed layer 60 is selected from the piezoelectric material other than that (PZT) constituting the piezoelectric elements 22, for example, PbTiO3 or PbLaTiO3, and is deposited by spattering, sol-gel coating, or MOCVD (metal organic chemical vapor deposition) to give a [001] crystalline orientation. Then, a piezoelectric layer 20 of PZT is deposited to extend over the seed layer 60 and the exposed first layer 10, as shown in FIG. 5F, by spattering, sol-gel coating, or MOCVD, and is sintered at a temperature of about 700° C. to develop into a corresponding crystalline element later formed into the piezoelectric elements 22 which has the same crystalline orientation as that of the seed layer, and the dielectric layer 24 of the patterned filter 4. Thereafter, a second layer 30 of electrically conductive metal same as the first layer is deposited on the piezoelectric layer 20 to give a laminate structure, as shown in FIG. 5G. Finally, the stack is processed to etch out the dielectric layer 20 and the second layer 30 so as to form the individual piezoelectric elements 22 and the dielectric layer 24, and at the same time the upper electrodes 32 of the resonators 21 on the piezoelectric elements 22, the strip line 34 with the stubs on the dielectric layer 24, and the bridges 33 and 35, thereby providing the bandpass filter having the combination of the BAW filter 2 and the patterned filter 4 formed on the common substrate 100.

Figure 6:
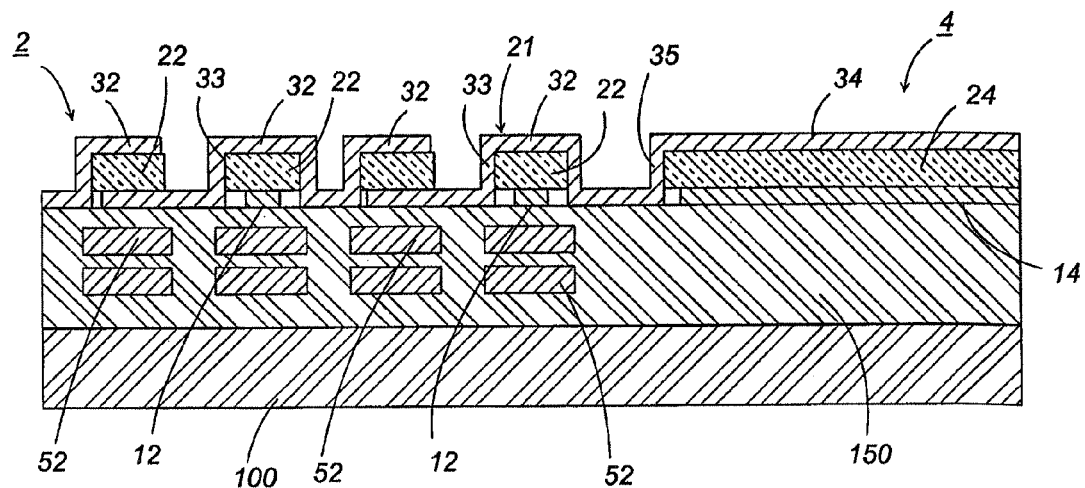
FIG. 6 is a sectional view illustrating a modification of the above bandpass filter.

FIG. 6 shows a modification of the above embodiment which is identical to the above embodiment except that acoustic mirrors 52 are employed instead of the cavities 12 to provide the individual resonators 21 as SMR (solidly mounted resonator) type. Like parts are designated by like reference numerals for easy recognition, and no duplicate explanation is made here. The acoustic mirrors 52 are made of tungsten and are embedded in an additional dielectric section 150 formed by a plurality of silicon oxide layers on the substrate 100.

Figure 7:
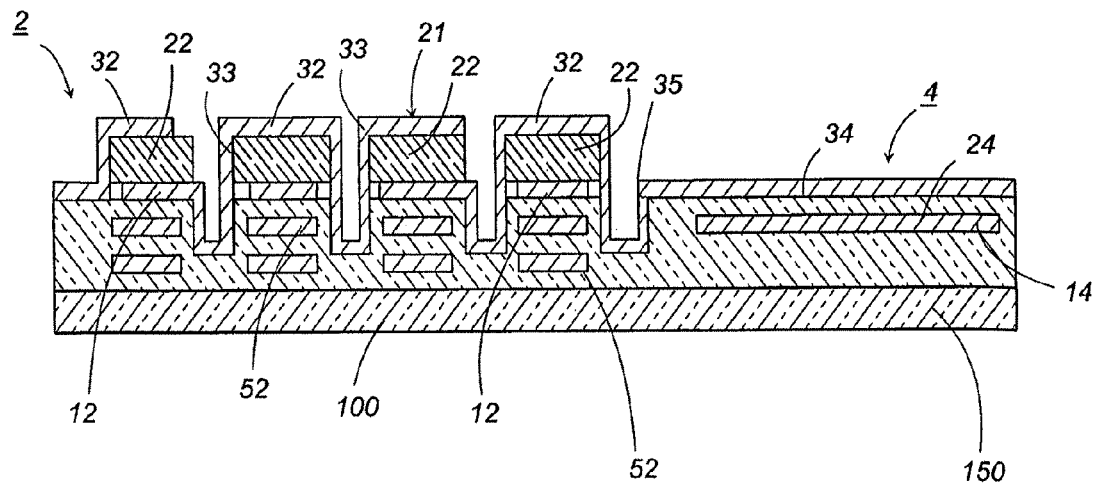
FIG. 7 is a sectional view of a bandpass filter in accordance with a second embodiment of the present invention.
Figure 8A:
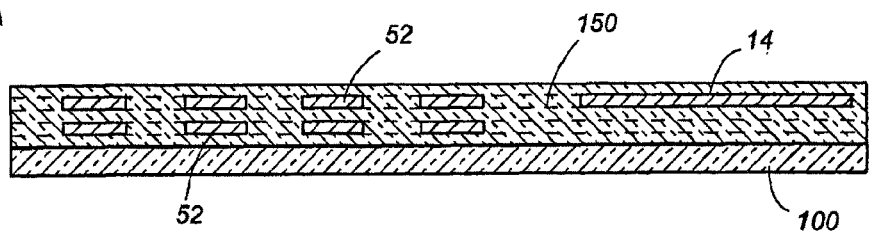
FIGS. 8A to 8E are sectional views illustrating steps of fabricating the above bandpass filter.
Figure 8B:
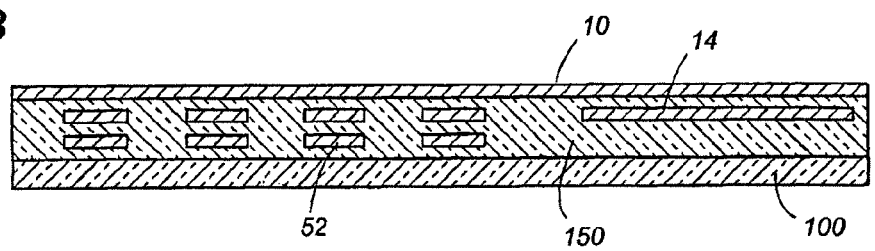
Figure 8C:
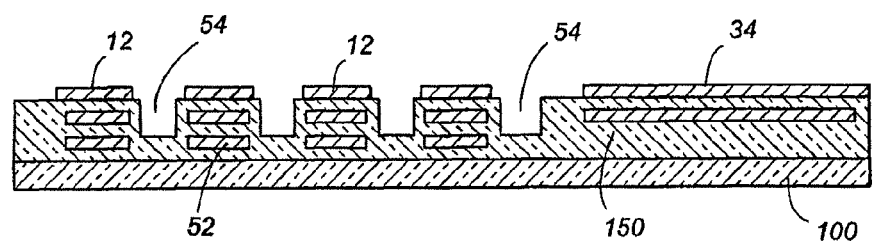
Figure 8D:
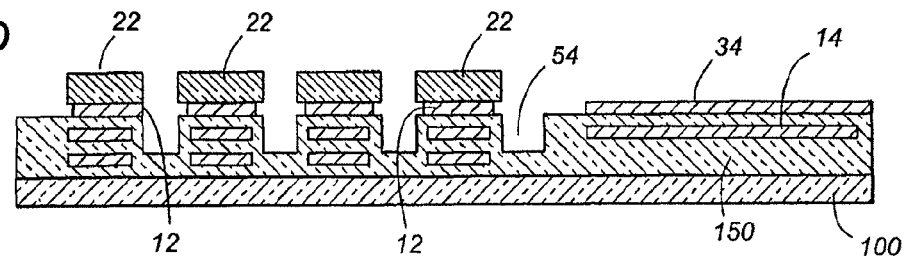
Figure 8E:
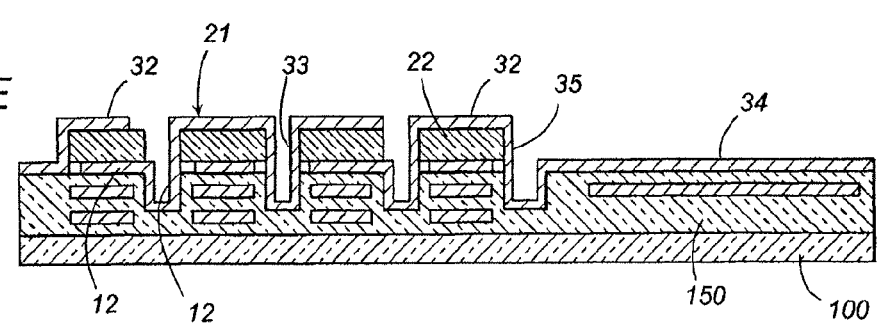
Figure 9:
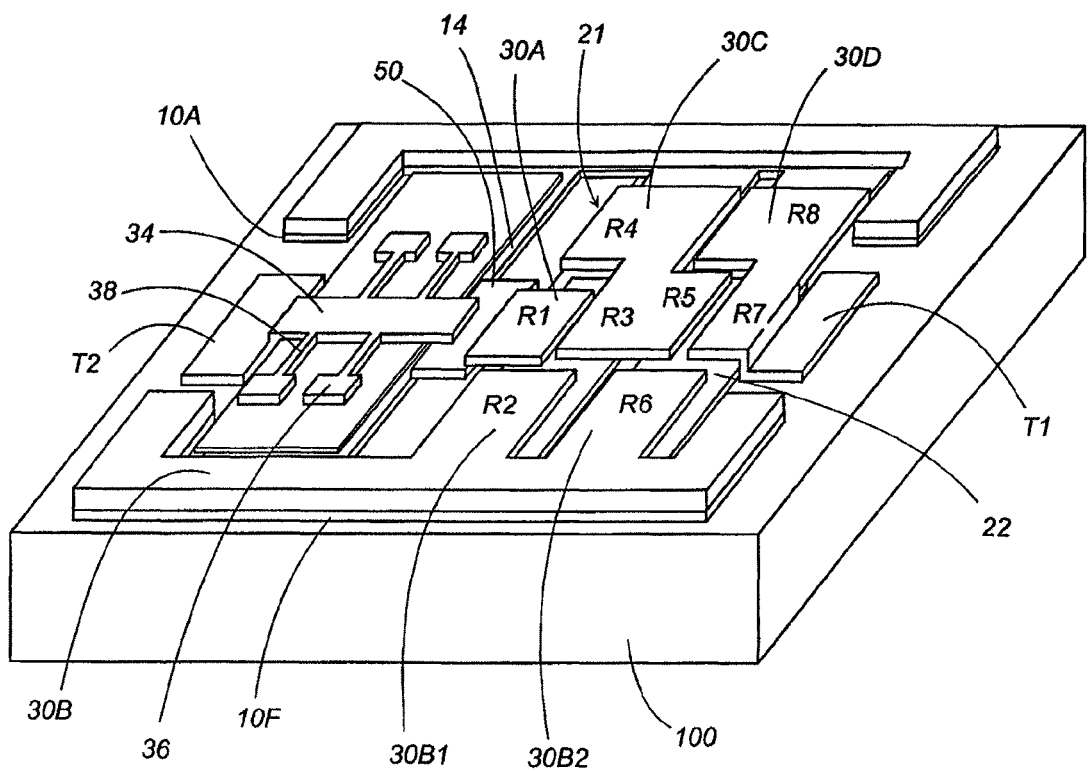
FIG. 9 is a perspective view of a bandpass filter in accordance with a third embodiment of the present invention.
Figure 10:
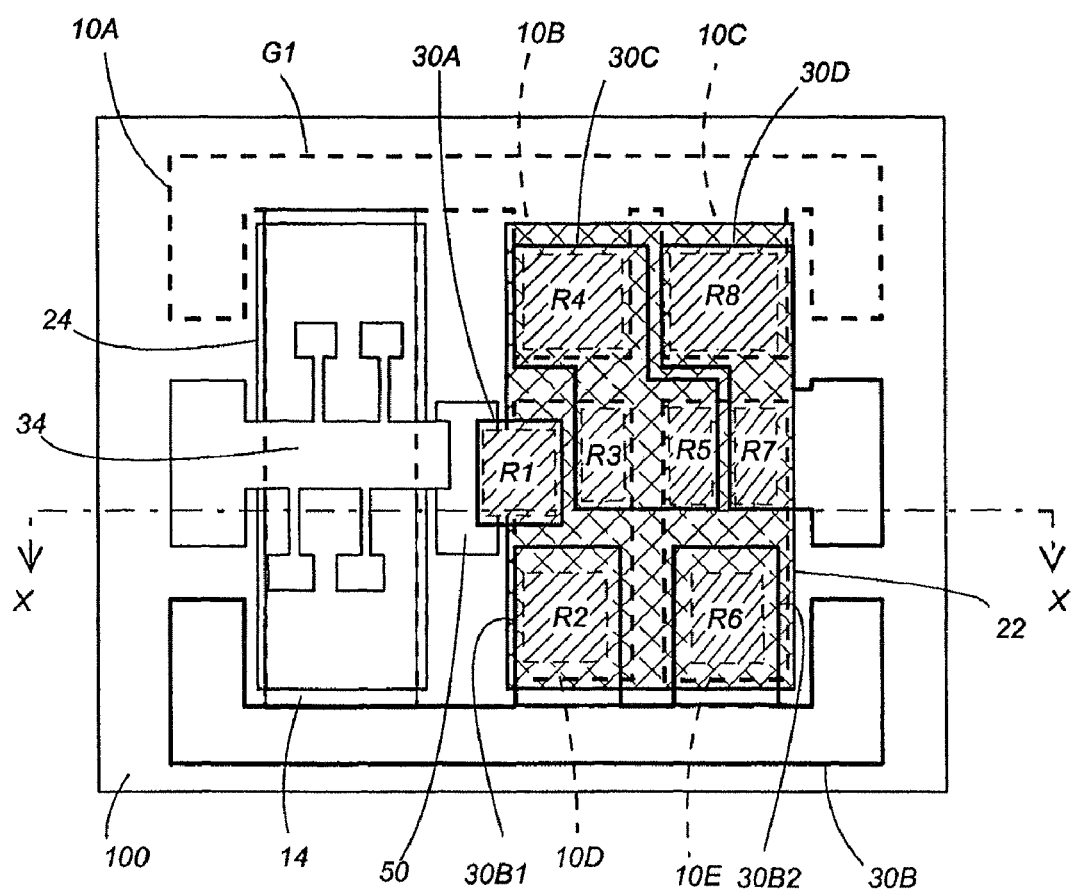
FIG. 10 is a plan view of the above bandpass filter.

FIG. 7 shows a bandpass filter in accordance with a second embodiment of the present invention which is similar to the above modification of the first embodiment except that the lower electrodes 12 of the BAW filter 2 and the strip line 34 of the patterned filter 4 are in level with each other, and are formed from a common metal layer. Like parts are designated by like reference numerals and no duplicate explanation is made herein for simplicity. Steps of fabricating the bandpass filter are now explained with reference to FIGS. 8A to 8E. First, a plurality of thin silicon oxide layers are successively superimposed on the silicon substrate 100 to build up a dielectric section 150 with the acoustic mirrors 52 and the ground conductor 14 being respectively embedded therein, as shown in FIG. 8A. Then, a metal layer 10 is deposited on the dielectric section 150, as shown in FIG. 8B, and is subsequently etched to form the lower electrodes 12 of the individual resonators as well as the strip line 34, as shown in FIG. 8C. At this step, the dielectric section 150 is partly etched out in its upper end to form concavities 54 between the adjacent areas on which the resonators are later developed, and between the area on which the resonator is later developed and an area on which the strip line 34 is formed. Then, a seed layer is formed on an area extending over the lower electrodes 12 followed by being coated by a piezoelectric material. After the piezoelectric material is sintered to have the same crystalline orientation as the seed layer and to incorporate the sinter layer therein, it is masked and etched to develop the piezoelectric elements 22 respectively on the lower electrodes 12, as shown in FIG. 8D. Thereafter, another metal layer is deposited to extend over the piezoelectric elements and is etched to give the individual upper electrodes 32 as well as the bridges 33 and 35, as shown in FIG. 8E. The bridges 33 are formed to interconnect the upper electrode 32 with the adjacent upper electrode 32 or the lower electrode 21, while the bridge 35 is formed to interconnect the strip line 34 to the adjacent upper electrode 32.

FIGS. 9 to 12 show a bandpass filter in accordance with a third embodiment of the present invention which is basically identical to the first embodiment except for its spatial arrangement. Like parts are designated by like reference numerals, and no duplicate explanation is made herein for simplicity.

The bandpass filter includes the silicon substrate 100 on which the patterned filter and the BAW filter are built up. In the following description, the piezoelectric resonators, the upper and lower electrodes of the BAW filter are designated differently than the previous embodiments only for the sake of easy understanding of specific structures of the present embodiment. The substrate 100 is formed with three separate ground layers, first one 10A including the ground conductor 14 and two lower electrodes 10B and 10C, a second one defining the lower electrode 10D, and the last one defining the lower electrode 10E. The ground conductor 14 is covered with the dielectric layer 24 of PZT on which the strip line 34 with a plurality of the stubs 36, 38 is deposited to realize the patterned filter.

Figure 11:
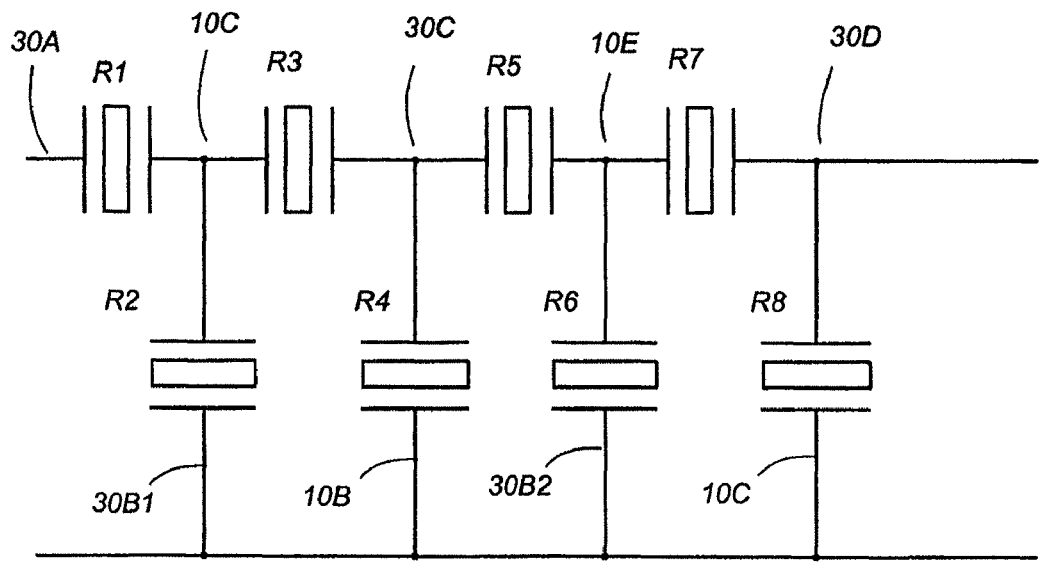
FIG. 11 is a circuit diagram illustrating a ladder connection of the BAW filter in the above bandpass filter.
Figure 12:
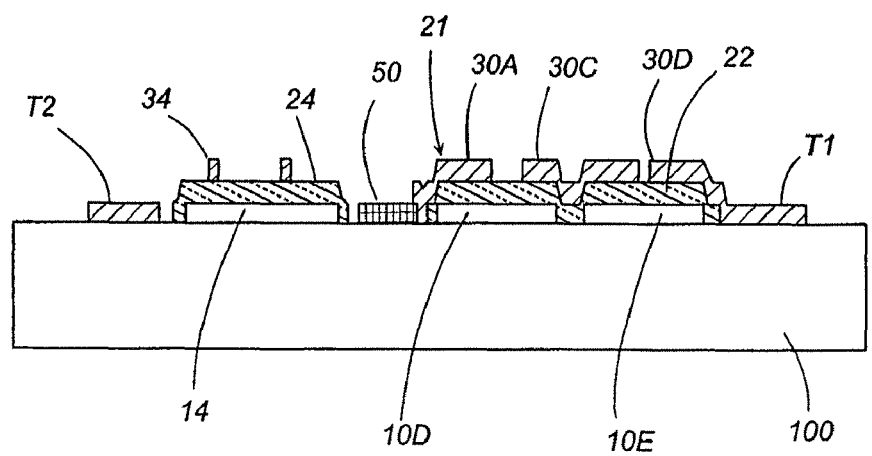
FIG. 12 is a cross section taken along a line X-X of FIG. 10.

The BAW filter is designed to include eight piezoelectric resonators R1 to R8 which are disposed in a two-dimensional arrangement with a single piezoelectric elements 22 common to the resonators, and which are electrically connected in a ladder configuration as shown in FIG. 11. The piezoelectric element 22 is made from PZT, and is formed to have the same as the dielectric layer 24. In order to realize the two-dimensional arrangement of the resonators, four separate upper electrodes 30A, 30B, 30C, and 30D are formed to cover corresponding portions of the piezoelectric element 22 in overlapping relations with the lower electrodes 10A to 10E, as will be explained below. The upper electrode 30B is formed with two spaced but electrically connected tabs 30B1 and 30B2. The upper electrode 30B is stacked on a corresponding part 10F of the ground layer 10A integral with the ground conductor 14 to define a ground line. The upper electrode 30A is connected at is one end to the strip line 34 through the attenuator 50 in the form of a poly-silicon resistor, and has the other end in an overlapping relation with the lower electrode 10D with a portion of the dielectric element 23 interposed therebetween to realize the resonator R1. The tab 30B1 of the upper electrode 30B overlaps the lower electrode 10D to realize the resonator R2. The upper electrode 30C has three portions overlapping respectively with different lower electrodes 10D, 10B, and 10C to realize different resonators R3, R4, and R5. The tab 30B2 overlaps with the lower electrode 10E to realize the resonator R6. The upper electrode 30D has two different portions overlapping respectively with the lower electrodes 10E and 10C to realize different resonators R7 and R8. The upper electrode 30D has its one end lowered on the substrate 100 to define thereat a signal terminal T1. Likewise, the strip line 34 has its one end lowered ton the substrate 100 to define thereat another signal terminal T2.

The present invention should not be interpreted to the above embodiments and encompass any combination of the individual features of the above embodiments.

The invention claimed is:

1. A bandpass filter comprising: a bulk acoustic wave (BAW) filter composed of a plurality of piezoelectric resonators connected in a ladder configuration between a first signal transmission path and a ground to provide a specific frequency bandpass, each piezoelectric resonator comprising a piezo-electric element disposed between a lower electrode and an upper electrode; a patterned planar filter being configured to attenuate frequencies near and outside of said bandpass, said planar filter comprising a strip line structure composed of a ground conductor, a dielectric layer on said ground conductor, and a strip line formed on said dielectric layer to define a second signal transmission path, wherein said strip line being added with at least one stub composed of a loading segment extending in a spaced relation from said strip line, and a tap segment extending from said strip line and merging at an intermediate portion of said loading segment between opposite lengthwise ends thereof, and said BAW filter and said planer filter are formed on a common substrate with said first and second signal transmission paths connected to each other.

2. A bandpass filter as set forth in claim 1, wherein said dielectric layer of said strip line structure is made of a dielectric material having a relative dielectric constant of 8 or more.

3. A bandpass filter as set forth in claim 1, wherein said dielectric layer of said strip line structure is made of the same material as that of the piezoelectric element of said piezoelectric resonator.

4. A bandpass filter as set forth in claim 1, wherein said dielectric layer of said strip line structure has a thickness equal to that of the piezoelectric element of each of said piezoelectric resonators.

5. A bandpass filter as set forth in claim 3, wherein said material is lead zirconate titanate (PZT).

6. A bandpass filter as set forth in claim 1, wherein said BAW filter comprises a single piezoelectric element, a plurality of separate upper electrodes each being laid over said piezoelectric element, and a plurality of separate lower electrodes each disposed under said piezoelectric element in contact therewith,
at least one of said upper electrodes having portions respectively overlapping with two or more different ones of said lower electrodes with corresponding portions of said piezoelectric element interposed therebetween, and at least one of said lower electrodes having portions respectively overlapping with two or more different ones of said upper electrodes with corresponding portions of said piezoelectric element interposed therebetween so as to define a plurality of said piezoelectric resonators which are disposed in a two-dimensional arrangement and are electrically connected with each other in a ladder configuration.

7. A process of fabricating a bandpass filter as defined in claim 1, said process comprising the steps of:
forming on said substrate a first layer of electrically conductive material which is later etched out to leave said lower electrode of each said piezoelectric resonator and said ground conductor on said substrate,
depositing a seed layer of a specific crystalline orientation on one part of said first layer;
forming a piezoelectric layer on said seed layer and on the other part of said first layer, said piezo-electric layer being later etched out to leave said piezo-electric elements and said dielectric layer;
forming a second layer of electrically conductive material over said piezo-electric layer to give a laminate structure, said second electrically conductive layer being later etched out to leave said upper electrode of each said piezoelectric resonator and said strip line; and
etching out said laminate structure to develop the plurality of said piezoelectric resonators and said strip line structure on said substrate.

8. A process as set forth in claim 7, wherein said seed layer is selected from a material which is different from that of said piezo-electric layer and controls epitaxial growth of said piezo-electric layer.

9. A process of fabricating a bandpass filter as defined in claim 1, said process comprising the steps of:
forming said ground conductor over one part of said substrate;
forming the dielectric layer on said ground conductor and over the other part of said substrate;

depositing a first layer of electrically conductive material on said dielectric layer, etching said first layer to leave said strip line and said lower electrode of each said piezoelectric resonator;

depositing a seed layer of a specific crystalline orientation on said lower electrode;

depositing a piezoelectric material on said seed layer and developing it into said piezoelectric element having the same crystalline orientation as said seed layer; and forming said upper electrodes on said each piezoelectric element.

\* \* \* \* \*